(12) United States Patent
Tung et al.

(10) Patent No.: US 10,901,022 B2
(45) Date of Patent: Jan. 26, 2021

(54) ELECTROSTATIC DETECTING DEVICE

(71) Applicant: INDUSTRIAL TECHNOLOGY RESEARCH INSTITUTE, Hsinchu (TW)

(72) Inventors: Mean-Jue Tung, Jincheng Township (TW); Shi-Yuan Tong, Zhudong Township (TW); Yu-Ting Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 133 days.

(21) Appl. No.: 16/036,672

(22) Filed: Jul. 16, 2018

(65) Prior Publication Data
US 2019/0204373 A1    Jul. 4, 2019

(30) Foreign Application Priority Data

Dec. 28, 2017   (TW) .............................. 106146123 A

(51) Int. Cl.
*G01R 29/12*      (2006.01)
*H05K 1/03*       (2006.01)
(Continued)

(52) U.S. Cl.
CPC ........... *G01R 29/12* (2013.01); *H05K 1/0215* (2013.01); *H05K 1/0306* (2013.01); *H05K 1/11* (2013.01);
(Continued)

(58) Field of Classification Search
CPC ........ G01R 29/12; H05K 1/0215; H05K 1/11; H05K 1/0306; H05K 2201/09263;
(Continued)

(56) References Cited

U.S. PATENT DOCUMENTS 4,739,349 A     4/1988  Lewiner et al.
6,258,655 B1 *  7/2001  Basceri .................. H01L 28/55
                                                      438/240

(Continued)

FOREIGN PATENT DOCUMENTS

CN       1760631 A      4/2006
CN     103235195 A      8/2013
(Continued)

OTHER PUBLICATIONS

TW Office Action in application No. 106146123 dated Mar. 8, 2018.
(Continued)

*Primary Examiner* — Daniel R Miller
(74) *Attorney, Agent, or Firm* — Maschoff Brennan

(57) ABSTRACT

An electrostatic detecting device adapted to an object. The electrostatic detecting device includes a substrate, a sensing electrode, a dielectric layer and a ground electrode. The substrate has a first surface and a second surface opposite to the first surface. The sensing electrode is disposed on the first surface and has a sensing surface. The sensing surface faces away from the first surface and configured to face the object. The dielectric layer having a dielectric constant greater than 1 is disposed on the second surface. The ground electrode is disposed apart from the sensing electrode by a spacing. The dielectric layer is disposed between the sensing electrode and the ground electrode.

8 Claims, 3 Drawing Sheets

(51) Int. Cl.
*H05K 1/11* (2006.01)
*H05K 1/02* (2006.01)

(52) U.S. Cl.
CPC ...... *H05K 1/119* (2013.01); *H05K 2201/0195* (2013.01); *H05K 2201/0939* (2013.01); *H05K 2201/09263* (2013.01); *H05K 2201/10151* (2013.01); *H05K 2201/2036* (2013.01)

(58) Field of Classification Search
CPC ... H05K 2201/2036; H05K 2201/0939; H05K 1/119; H05K 2201/10151; H05K 2201/0195
See application file for complete search history.

(56) References Cited

U.S. PATENT DOCUMENTS

| | | | |
|---|---|---|---|
| 6,476,620 | B2 | 11/2002 | Kato et al. |
| 6,608,483 | B1 | 8/2003 | Hill |
| 8,536,879 | B2 | 9/2013 | Renno et al. |
| 9,178,010 | B2 | 11/2015 | Malhotra et al. |
| 2002/0063564 | A1 | 5/2002 | Urano et al. |
| 2007/0296085 | A1 | 12/2007 | Coolbaugh et al. |
| 2011/0102097 | A1 | 5/2011 | Payan et al. |
| 2014/0212576 | A1 | 7/2014 | Fujii et al. |
| 2019/0198678 | A1* | 6/2019 | Takechi ............ H01L 29/78696 |

FOREIGN PATENT DOCUMENTS

| | | |
|---|---|---|
| CN | 206331047 U | 7/2017 |
| CN | 206331052 U | 7/2017 |
| EP | 2158494 B1 | 4/2016 |
| JP | H4102001 A | 4/1992 |
| JP | 2002162429 A | 6/2002 |
| TW | 550757 B | 9/2003 |
| TW | 200807684 A | 2/2008 |
| TW | 201439030 A | 10/2014 |
| TW | 201621262 A | 6/2016 |
| TW | M534342 U | 12/2016 |
| TW | M535326 U | 1/2017 |
| TW | M535326 U * | 1/2017 |
| WO | 2016003153 A1 | 1/2016 |

OTHER PUBLICATIONS

Tajdari, Teimour, et al. "Low Noise Signal Conditioning Design for Electrostatic Sensors." Sensors & Transducers 153.6 (2013): 200-208.
Tajdari, Teimour, Mohd Fua'ad Rahmat, and Norhaliza Abdul Wahab. "New technique to measure particle size using electrostatic sensor." Journal of Electrostatics 72.2 (2014): 120-128.
Bateman, M. G., et al. "A low-noise, microprocessor-controlled, internally digitizing rotating-vane electric field mill for airborne platforms." Journal of Atmospheric and Oceanic Technology 24.7 (2007): 1245-1255.
CN Office Action in Application No. 201711456483.2 dated Sep. 29, 2020.
CN Office Action in Application No. 201711456473.2 dated Sep. 29, 2020.

* cited by examiner

ELECTROSTATIC DETECTING DEVICE

CROSS-REFERENCE TO RELATED APPLICATIONS

This non-provisional application claims priority under 35 U.S.C. § 119(a) on Patent Application No(s). 106146123 filed in Taiwan, R.O.C. on Dec. 28, 2017, the entire contents of which are hereby incorporated by reference.

TECHNICAL FIELD

The disclosure relates to an electrostatic detecting device.

BACKGROUND

With the development of technology and the demand of market, the trends of designing electronic products such as smart phones and tablets develop towards concepts of slim types and multi-functional types. However, electronic elements/components are often affected by the static electricity interference occurring in the manufacturing process of high precision and miniaturization because of the kind of trends. And accordingly electronic elements or module structures are broken through by static electricity, resulting in malfunction and damages. Accordingly, both of the production yield and the product quality are degraded.

Furthermore, most of conventional electrostatic sensors are designed based on handheld or fixed-point measurements. These kinds of conventional electrostatic sensor are not capable of performing a real-time monitoring. In addition, it gradually becomes a trend that the electrostatic detectors are integrated with manufacturing equipments. However, the problem of failure of the element sensitivity due to the high amount or a peak of static electricity instantaneously occurring in short-distance detection is one of essential issues in the art need to be concerned.

SUMMARY

An electrostatic detecting device adapted to an object is disclosed according to one embodiment of the present disclosure. The electrostatic detecting device includes a substrate, a sensing electrode, a dielectric layer and a ground electrode. The substrate has a first surface and a second surface opposite to the first surface. The sensing electrode is disposed on the first surface and has a sensing surface. The sensing surface faces away from the first surface and configured to face the object. The dielectric layer is disposed on the second surface and has a dielectric constant greater than 1. The ground electrode is disposed apart from the sensing electrode by a spacing. The dielectric layer is disposed between the sensing electrode and the ground electrode.

An electrostatic detecting device adapted to an object is disclosed according to another embodiment of the present disclosure. The electrostatic detecting device includes a substrate, a sensing electrode, a dielectric layer and a ground electrode. The substrate has a first surface and a second surface opposite to the first surface. The sensing electrode is disposed on the first surface and has a sensing surface facing away from the first surface. The dielectric layer is disposed on the sensing surface of the sensing electrode. The dielectric layer is configured to be disposed apart from the object and has a dielectric constant greater than 1. The ground electrode is disposed apart from the substrate by a spacing. The second surface faces the ground electrode.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
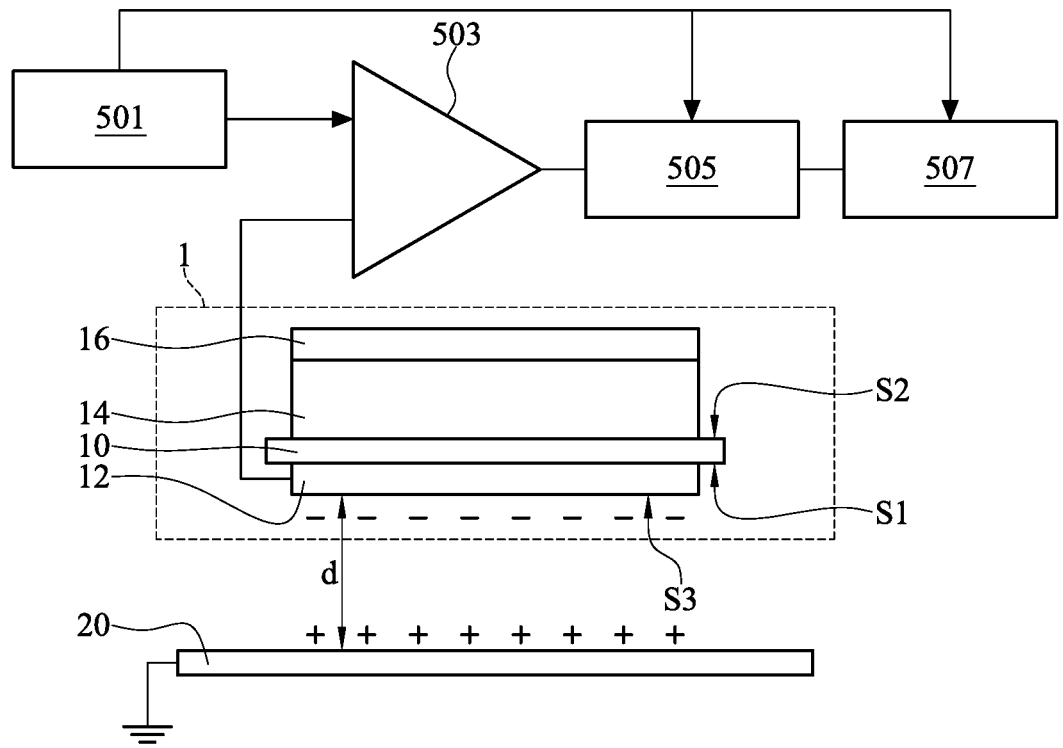
FIG. 1 is a diagram of structure of an electrostatic detecting device according to one embodiment of the present disclosure.

Please refer to FIG. 1, which is a diagram of structure of an electrostatic detecting device according to one embodiment of the present disclosure. As shown in FIG. 1, an electrostatic detecting device 1 is adapted to an object 20. The electrostatic detecting device 1 includes a substrate 10, a sensing electrode 12, a dielectric layer 14 and a ground electrode 16. The substrate 10 has a first surface S1 and a second surface S2 opposite to the first surface S1. In practice, the substrate 10 is a circuit board where some circuits are arranged. The substrate 10 is, for example, a flexible printed circuit board (FPCB) including non-conductive materials. The sensing electrode 12 is disposed on the first surface S1 of the substrate 10, and the sensing electrode 12 has a sensing surface S3. The sensing surface S3 faces away from the first surface S1 and configured to face the object 20 so as to detect an amount of electrostatic charges spreading over the surface of the object 20. In one embodiment, the sensing electrode 12 is selected from a group consisting of a single flat type, a meander-shaped type, a curved type, a 3D type, and a combination thereof. In one embodiment, the material of the object 20 is selected from a group consisting of metals, insulators, and a combination thereof. In another embodiment, the object 20 includes one selected from a group consisting of a silicon substrate, a glass substrate, a plastic substrate, and a combination thereof.

The dielectric layer 14 is disposed on the second surface S2 of the substrate 10. The ground electrode 16 is disposed apart from the sensing electrode 12 by a spacing, and the dielectric layer 14 is disposed between the sensing electrode 12 and the ground electrode 16. In practice, materials included in the sensing electrode 12 and/or the ground electrode 16 includes one selected from a group consisting of copper, silver, platinum, and a combination thereof. In one embodiment, materials of the dielectric layer 14 include an oxide $ABO_3$ having perovskite structure, wherein A stands for one selected from a group consisting of Ba, Pb, Mg and a combination thereof, and B stands for one selected from a group consisting of Ti, Zr, Hf, Sn, Ta, Mn, Co, Fe, Ni, Zn, Al, Mg and a combination thereof. In one embodiment, the dielectric layer 14 includes a single bulk material or a multi-layer composite. The types and materials of electrodes and the object mentioned in the above embodiments are given for illustration only, and the present disclosure is not limited to the above embodiments. In an embodiment, a thickness of the dielectric layer is 1 millimeter (mm). In one embodiment, the dielectric constant of the dielectric layer 14 is greater than 1. In another embodiment, the dielectric constant of the dielectric layer 14 is greater than 2. In a further another embodiment, the dielectric constant of the dielectric layer 14 is greater than 10. In practice, when a dielectric layer having a low dielectric constant is replaced with another dielectric layer having a high dielectric constant, the strength of the sensing signal detected by the electrostatic detecting device is significantly reduced so that the malfunction of detection due to oversaturation of the elements is avoided.

Figure 2:
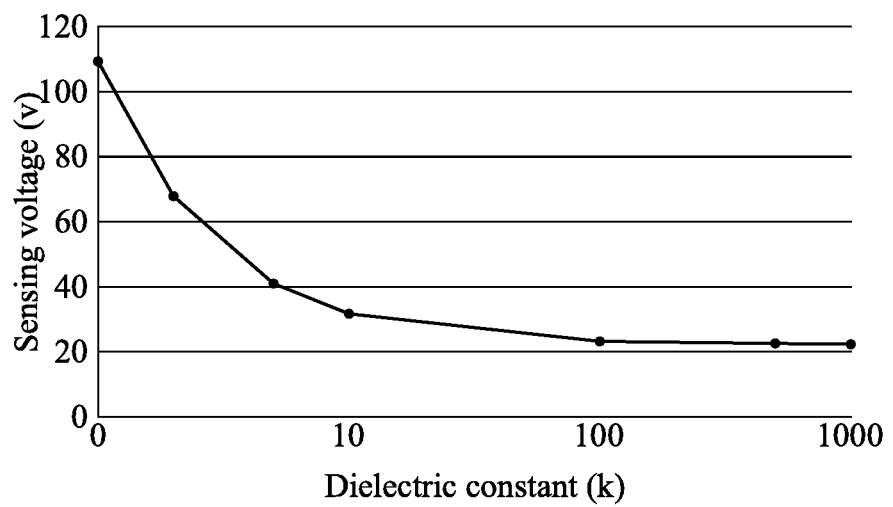
FIG. 2 is a diagram of variation of sensing voltage detected by the electrostatic detecting device with respect to different dielectric constants k according to one embodiment of the present disclosure.

In a practical example, assume that the size of the sensing electrode 12, the ground electrode 16 and the object 20 are selected based on scale of 10 mm×10 mm, and the thicknesses of both of the dielectric layer 14 and the object 20 are 1 mm. As shown in FIG. 1, the object 20, the sensing electrode 12, the dielectric layer 14 and the ground electrode 16 are disposed sequentially from the bottom to the top. Please further refer to FIG. 2 regarding the evaluation of the electrostatic detecting device with respect to different dielectric constants k. FIG. 2 is a diagram of variation of sensing voltage detected by the electrostatic detecting device with respect to different dielectric constants k, wherein the sensing voltage is on the vertical axis and the dielectric constant represented in "log" is on the horizontal axis. In practice, when the dielectric constant k is equal to 1 (namely air dielectric), the sensing voltage is approximately equal to a divided voltage in the space. When the dielectric constant k is greater than 1, the internal electric field of the dielectric layer is decreased to be 1/k approximately. In the condition in which the sensing distance d is equal to 10 mm or 5 mm, when the dielectric layer disposed in the electrostatic detecting device has a dielectric constant k of 10, the sensing voltage corresponding to the dielectric constant k of 10 is decreased to be 1/10 of the sensing voltage corresponding to the dielectric constant k of 1 (namely air dielectric). As shown in FIG. 2, when the dielectric constant k increases from 1 to 1000, the sensing voltage decreases from 110 volts to 20 volts. Specifically, the sensing voltage is approximate equal to 50 volts when the dielectric constant k is equal to 3.5; the sensing voltage is approximate equal to 35 volts when the dielectric constant k is equal to 7.5; the sensing voltage is approximate equal to 30 volts when the dielectric constant k is equal to 10; the sensing voltage is approximate equal to 25 volts when the dielectric constant k is equal to 100. It is realized that the strength of the sensing voltage is decreased significantly by disposing the dielectric layer on the backside of the sensing electrode. Therefore, the oversaturation of the elements within the electrostatic detecting device, occurring in the process of detection, is avoided accordingly. In addition, adjustment of the dynamic range for short-distance detection is improved. In practice, when the electrostatic detecting device detects an amount of electrostatic charges related to the object, as shown in FIG. 1, the electrostatic detecting device further includes a power supplying unit 501, an amplifier 503, a data-analyzing unit 505 and a computer monitoring unit 507. The power supplying unit 501 is configured to supply power to the amplifier 503, the data-analyzing unit 505 and the computer monitoring unit 507. The amplifier 503 is electrically connected to the sensing electrode 12 and configured to amplify the signal detected by the sensing electrode 12. In other words, when electrostatic interference occurs on the surface of the object 20, the sensing electrode 12 of the electrostatic detecting device 1 detects a sensing signal and sends the sensing signal to the amplifier 503 so that the sensing signal is amplified by the amplifier 503. Further, the amplifier 503 outputs the sensing signal amplified to the data-analyzing unit 505 so that the sensing signal amplified is analyzed by the data-analyzing unit 505. The data-analyzing unit 505 sends the relevant information regarding the sensing signal to the computer monitoring unit 507 so that the engineers obtain the state of electrostatic detection about the object. In practice, the power supplying unit 501, the data-analyzing unit 505 and the computer monitoring unit 507 are respectively a power supply, a processor having functions of computation and a monitor equipped in a computer. Since those elements mentioned above are generally constructed according to actual demands, detailed descriptions regarding those elements are not repeated herein.

Figure 3:
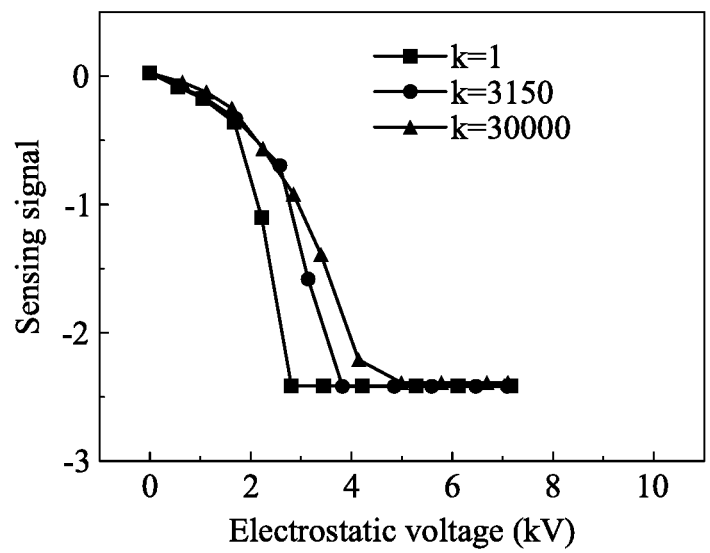
FIG. 3 is a diagram of variations of the sensing signals with respect to different dielectric layers according to one embodiment of the present disclosure.
Figure 4:
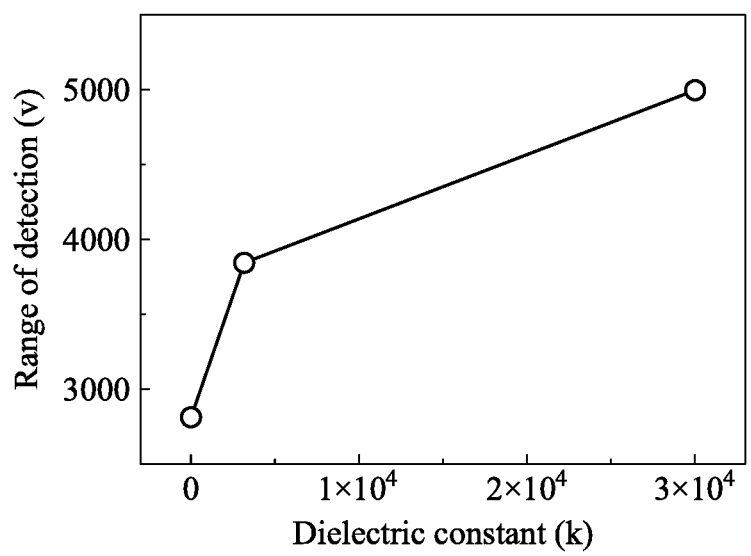
FIG. 4 is a diagram of dynamic range of detection corresponding to different dielectric layers according to one embodiment of the present disclosure.

In practice, the sensing signal detected by the electrostatic detecting device disclosed in the present disclosure is determined based on the dielectric constant of the dielectric layer. For example, please further refer to FIG. 3, which is a diagram of variations of the sensing signals with respect to different dielectric layers. As shown in FIG. 3, the variations of the sensing signals detected from the dielectric layers having different dielectric constants are different from one another. Specifically, the dielectric layer (air dielectric) having a dielectric constant k of 1 is capable of detecting a sensing signal in a range of 2800 volts. The dielectric layer having a dielectric constant k of 3150 is capable of detecting a sensing signal in a range of 3800 volts. The dielectric layer having a dielectric constant k of 30000 is capable of detecting a sensing signal in a range of 5000 volts. In other words, as shown in FIG. 3, when a dielectric layer having a high dielectric constant k is disposed, the range of the sensing signals detected by the electrostatic detecting device is raised. For example, when the dielectric layer having a dielectric constant k of 1 is replaced with the dielectric layer having a dielectric constant k of 30000, the range of sensing signals is raised approximately 77%. In practice, the higher the dielectric constant of the dielectric layer is, the wider the range of sensing signals is. Please refer to FIG. 4, which is a diagram of dynamic range of detection corresponding to different dielectric layers according to one embodiment of the present disclosure. As shown in FIG. 4, when a dielectric layer having a dielectric constant is replaced with another dielectric layer having another dielectric constant, the dynamic range of detection becomes wider due to the adjustment applied to the electric field. Thereby, the electrostatic detecting device is capable of avoiding the malfunction of electrostatic detection and remains its detection function without being affected by a high amount or a peak of static charges occurring in short-distance detection. The thickness of the dielectric layer is selected by a user according to actual factors (e.g. subject voltage or detection distance) as well as the dielectric constant. The dielectric layer includes, for example, thin-film materials having a thickness in nanometer scale, thick-film materials having a thickness in micro scale or bulk materials having a thickness millimeter scale.

Figure 5:
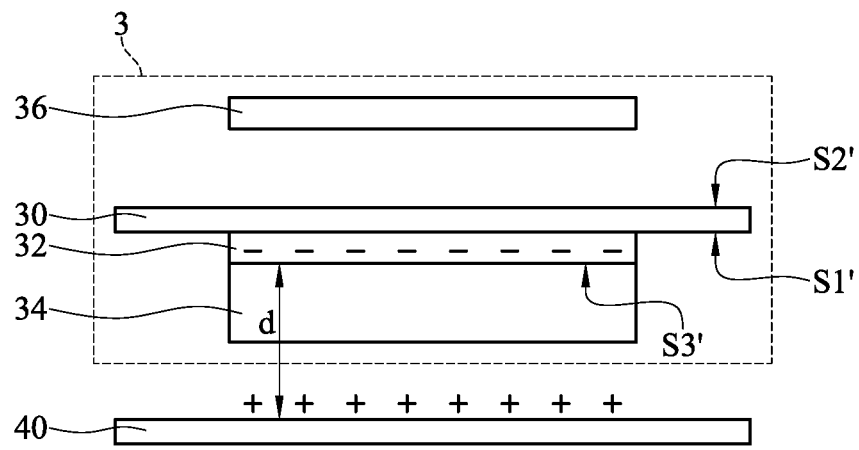
FIG. 5 is a diagram of structure of an electrostatic detecting device according to another embodiment of the present disclosure.

Please refer to FIG. 5, which is a diagram of structure of an electrostatic detecting device according to another embodiment of the present disclosure. The electrostatic detecting device 3 in the embodiment of FIG. 5 approximately has the same elements as the electrostatic detecting device 1 in the embodiment of FIG. 1. The significant difference between the embodiment of FIG. 5 and the embodiment of FIG. 1 lies in the position where the dielectric layer is disposed. Specifically, as shown in FIG. 5, the electrostatic detecting device 3 is adapted to the object 40. The electrostatic detecting device 3 includes a substrate 30, a sensing electrode 32, a dielectric layer 34 and a ground electrode 36. The substrate 30 has a first surface S1' and a second surface S2' opposite to the first surface S1'. In practice, the substrate 30 is a circuit board where some circuits are disposed. The substrate 30 is, for example, a flexible printed circuit board (FPCB) including non-conductive materials. The sensing electrode 32 is disposed on the first surface S1', and the sensing electrode 32 has a sensing surface S3'. The sensing surface S3' faces away from the first surface S1', and the sensing surface S3' is configured to detect an amount of electric charges spreading over the surface of the object 40. The dielectric layer 34 is disposed on the sensing surface S3' of the sensing electrode 32, and the dielectric layer 34 is configured to be disposed apart from the object 40 by a spacing. The second surface S2' of the substrate 30 faces the ground electrode 36.

In one embodiment, the sensing electrode 32 has one selected from a group consisting of a single flat type, a meander-shaped type, a curved type, a 3D type and a combination thereof. In one embodiment, materials of the object 40 include one selected from a group consisting of metals, insulators and a combination thereof. In another embodiment, the object 40 includes one selected from a group consisting of a silicon substrate, a glass substrate, a plastic substrate and a combination thereof. In practice, materials of the sensing electrode 32 and/or the ground electrode 36 includes one selected from a group consisting of copper, silver, platinum and a combination thereof. In one embodiment, materials of the dielectric layer 34 include an oxide $ABO_3$ having perovskite structure, wherein A stands for one selected from a group consisting of Ba, Pb, Mg and a combination thereof. B stands for one selected from a group consisting of Ti, Zr, Hf, Sn, Ta, Mn, Co, Fe, Ni, Zn, Al, Mg and a combination thereof. The dielectric layer 34 includes a single bulk material or a multi-layer composite. In one embodiment, the thickness of the dielectric layer 34 is 1 mm. In one embodiment, the dielectric constant of the dielectric layer 34 is greater than 1. In another embodiment, the dielectric constant of the dielectric layer 34 is greater than 2. In further another embodiment, the dielectric constant of the dielectric layer 34 is greater than 10. The types and materials of electrodes and the object mentioned in the above embodiments are given for illustration only, and the present disclosure is not limited to the above embodiments.

Figure 6:
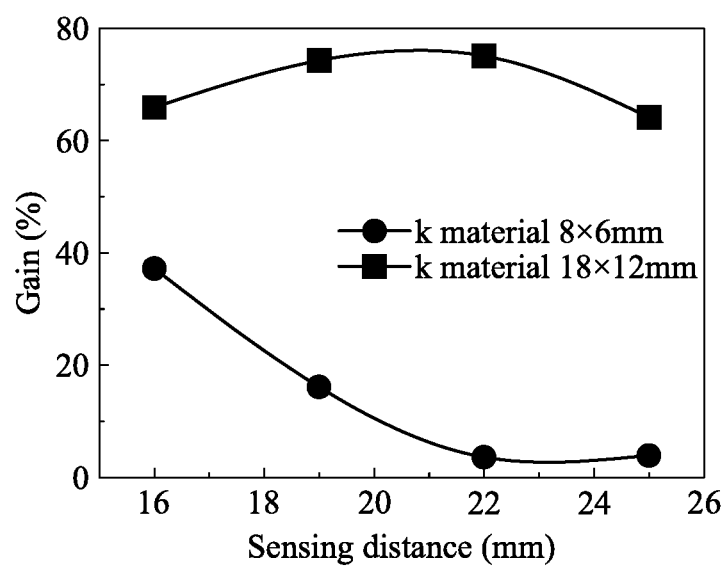
FIG. 6 is a diagram of sensitivity variation according to one embodiment of the present disclosure.

In the embodiment of FIG. 5, the dielectric layer 34 is disposed below the sensing electrode 32 so that the sensitivity of electrostatic detection by the electrostatic detecting device is improved significantly. In a practical example, please further refer to FIG. 6, which is a diagram of sensitivity variation according to one embodiment of the present disclosure. FIG. 6 is given to illustrate the dielectric layer 34 having a dielectric constant k of 3000. As shown in FIG. 6, the sensitivity gain (%) obtained by each of the dielectric layers having different sizes from each other varies with respect to a variety of distances d. The sensitivity gain (%) is calculated based on the equation of $(V-V_0)/V_0 \ast 100\%$, wherein the label V stands for the sensing signal detected when dielectric layer 34 is disposed. While the label $V_0$ stands for the sensing signal detected when the dielectric layer 34 is not disposed (namely air dielectric). In the case that the size of the dielectric layer (k material) is in 8 mm×6 mm, the sensitivity gain is around 38% when the sensing distance is 16 mm; the sensitivity gain is around 16% when the sensing distance is 19 mm; the sensitivity gain is around 4% when the sensing distance is 22-25 mm. In the case that the size of the dielectric layer (k material) is in 18 mm×12 mm, the sensitivity gain is around 65% when the sensing distance is 16 mm; the sensitivity gain is around 75% when the sensing distance is 19 mm; the sensitivity gain is around 76% when the sensing distance is 22 mm; the sensitivity gain is around 65% when the sensing distance is 25 mm. However, regardless of the value of sensing distance d, as shown in FIG. 5, the sensitivity (gain) is raised when the dielectric layer 34 is disposed below the sensing electrode 32. In other words, by taking the advantage of the electrostatic detecting device shown in FIG. 5, the sensitivity and the sensing distance are increased significantly. The present disclosure provides an electrostatic detecting device, including a dielectric layer disposed between the substrate and the ground electrode as well as another dielectric layer disposed below sensing electrode, by referring to structural features of FIG. 1 and FIG. 5, so as to achieve the purpose of adjusting the dynamic range of detection as well as improving the sensitivity.

Based on the above description, in the electrostatic detecting device disclosed in the present disclosure, by integrating the dielectric layer and the sensing electrode, the organization of the electric field is controlled by electrical coupling of the dielectric layer so that the dynamic range of electrostatic detection is adjusted. By taking the advantages of the structure of the electrostatic detecting device, the problem of low sensitivity and malfunction of detection, caused by the oversaturation of detection elements due to the high amount or the peak of electrostatic charges occurring within limited spaces of manufacturing equipments, would be overcome accordingly. Furthermore, the dynamic range of detection is allowed to be adjusted by disposing the dielectric layer into the device so as to improve the performance of the electrostatic detection in a short-distance.

What is claimed is:

1. An electrostatic detecting device adapted to an object, comprising:
   a substrate having a first surface and a second surface opposite to the first surface;
   a sensing electrode disposed on the first surface and having a sensing surface, with the sensing surface facing away from the first surface and configured to directly face the object and apart from the object by a spacing;
   a dielectric layer disposed on the second surface and having a dielectric constant greater than 1; and
   a ground electrode disposed apart from the sensing electrode by a spacing, with the dielectric layer disposed between the sensing electrode and the ground electrode.

2. The electrostatic detecting device according to claim 1, wherein the dielectric constant of the dielectric layer is greater than 2.

3. The electrostatic detecting device according to claim 1, wherein materials of the dielectric layer comprise an oxide ABO3 having perovskite structure, wherein A stands for one selected from a group consisting of Ba, Pb, Mg and a combination thereof; B stands for one selected from a group consisting of Ti, Zr, Hf, Sn, Ta, Mn, Co, Fe, Ni, Zn, Al, Mg and a combination thereof.

4. The electrostatic detecting device according to claim 1, wherein the dielectric layer comprises a single bulk material or a multi-layer composite.

5. An electrostatic detecting device adapted to an object, comprising:
- a substrate having a first surface and a second surface opposite to the first surface;
- a sensing electrode disposed on the first surface and having a sensing surface facing away from the first surface;
- a dielectric layer disposed on the sensing surface of the sensing electrode, with one side of the dielectric layer facing away the sensing surface configured to directly face the object and be disposed apart from the object by a spacing and having a dielectric constant greater than 1; and
- a ground electrode disposed apart from the substrate by a spacing, with the second surface facing the ground electrode.

6. The electrostatic detecting device according to 5, wherein the dielectric constant of the dielectric layer is greater than 2.

7. The electrostatic detecting device according to 5, wherein materials of the dielectric layer comprises an oxide ABO3 having perovskite structure, wherein A stands for one selected from a group consisting of Ba, Pb, Mg and a combination thereof; B stands for one selected from a group consisting of Ti, Zr, Hf, Sn, Ta, Mn, Co, Fe, Ni, Zn, Al, Mg and a combination thereof.

8. The electrostatic detecting device according to 5, wherein the dielectric layer comprises a single bulk material or a multi-layer composite.

* * * * *